United States Patent [19]

Mehrgardt

[11] Patent Number: 4,721,905
[45] Date of Patent: Jan. 26, 1988

[54] DIGITAL PHASE METER CIRCUIT

[75] Inventor: Soenke Mehrgardt, March, Fed. Rep. of Germany

[73] Assignee: Intermetall, division of Ditti, Freiburg, Fed. Rep. of Germany

[21] Appl. No.: 940,592

[22] Filed: Dec. 11, 1986

[51] Int. Cl.$^4$ .............................................. G01R 25/00
[52] U.S. Cl. .................. 324/83 D; 324/79 D; 328/133; 307/514
[58] Field of Search ............... 324/83 D, 83 R, 77 H, 324/79 D; 328/133; 307/514; 377/43

[56] References Cited

U.S. PATENT DOCUMENTS

| | | |
|---|---|---|
| 3,984,771 | 10/1976 | Nossen et al. .................. 324/79 D |
| 4,025,848 | 5/1977 | Delagrange ..................... 324/83 |
| 4,144,572 | 3/1979 | Starner et al. ................. 328/133 |
| 4,471,299 | 9/1984 | Elmis ............................. 324/79 D |

FOREIGN PATENT DOCUMENTS 0043407  1/1982  European Pat. Off. .
0122491  10/1984  European Pat. Off. .
5932175  10/1985  Japan ............................ 324/83 D Primary Examiner—Stewart J. Levy
Assistant Examiner—Louis M. Arana
Attorney, Agent, or Firm—T. L. Peterson

[57] ABSTRACT

To determine the phase difference between the edge of a pulse of a first clock signal and the edge of a pulse of a second clock signal with an integrable phase meter circuit, the second clock signal is fed through a frequency-divider circuit to the input of an unclocked delay line including m delay elements, and to a second register containing m cells, while the m cells of a first register are clocked by the first clock signal. The outputs of the kth register cells are compared in the kth XOR gate of a row of m XOR gates, so that, when the levels of these outputs are unlike, a logic 1 appears at the output of the kth gate. The phase is obtained at the n-bit output of a multiple adder adding the logic levels, the accuracy corresponding to m, which is preferably equal to $2^n$.

2 Claims, 2 Drawing Figures

DIGITAL PHASE METER CIRCUIT

BACKGROUND OF THE INVENTION

The invention pertains to a digital phase meter.

EP-A1-0 122 491 discloses a digital phase meter circuit for determining the phase difference between the edge of a pulse of a first clock signal and the edge of a pulse of a second clock signal in the sampling interval of two pulses of the second clock signal. In one embodiment of this phase meter circuit, the pulse of a first clock signal is derived from the horizontal flyback pulse of the horizontal deflection circuit of a television receiver, and the phase difference from a pulse of a second clock signal derived from the transmitted phase reference pulse is determined. That phase meter circuit contains an A/D converter which must be clocked at a multiple of the horizontal flyback pulse repetition rate, a switchable multiplier following the A/D converter, and a clocked integrator.

One object of the invention is to provide a digital phase meter circuit which is suitable for monolithic integration and which requires a smaller amount of circuitry than the prior art circuit so that the area required on the integrated-circuit chip is limited.

SUMMARY OF THE INVENTION

To determine the phase difference between the edge of a pulse of a first clock signal and the edge of a pulse of a second clock signal with an integrable phase meter circuit, the second clock signal is fed through a frequency-divider circuit to the input of an unclocked delay line including m delay elements, and to a second register containing m cells, while the m cells of a first register are clocked by the first clock signal. The outputs of the kth register cells are compared in the kth XOR gate of a row of m XOR gates, so that, when the levels of these outputs are unlike, a logic 1 appears at the output of the kth gate. The phase is obtained at the n-bit output of a multiple adder adding the logic levels, the accuracy corresponding to m, which is preferably equal to $2^n$.

It is advantageous to equip the digital phase meter circuit according to the invention with m delay elements, m register cells, m XOR gates (exclusive-OR gates), and a multiple adder whose output provides an n-bit signal, where $m=2^n$, and n is an integer. In that case, if the output signal of the multiple adder is interpreted as a binary fraction, the output of the binary adder directly provides the digital values of the positions of the edges of the pulses of the first clock signal relative to the edge of a pulse of the second clock signal in the sampling interval of two pulses of the second clock signal.

BRIEF DESCRIPTION OF THE DRAWING

The invention will be better understood from a reading of the following detailed description in conjunction with the drawing in which.

DETAILED DESCRIPTION

Since the components of the digital phase meter circuit according to the invention are conventional integrable circuits, namely a frequency a divider, a delay line of known design, conventional registers, a multiple adder and XOR gates whose realization is known, these circuit components need not be described in detail here. The XOR gates, for example, can be gates as described in PCT publication WO 85/02957.

Figure 1:
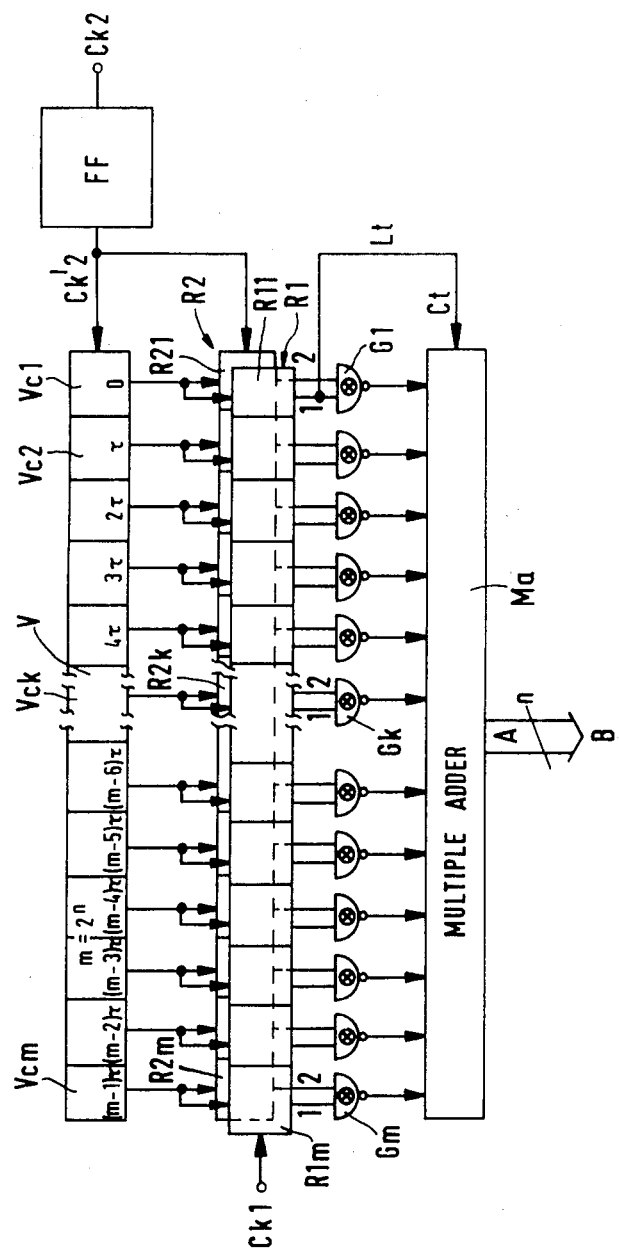
FIG. 1 is a block diagram of the digital phase meter circuit in accordance with the invention, and FIG. 2 serves to explain the operation of the digital phase meter circuit in accordance with the invention.

FIG. 1 shows a block diagram of the digital phase meter circuit in accordance with the invention, which is suitable for monolithic integration and takes up relatively little area on the integrated-circuit chip. The clock signal Ck2 is fed through the frequency-divider circuit FF, e.g., a JK flip-flop, into the delay line V. The latter consists of m delay elements Vc1 ... Vcm, each of which produces the delay. If the invention is used in television receivers, the delay will preferably be in the range from 1.5 ns to 3.5 ns. The contents of the delay line V are transferred into the row of m cells R21 ... R2m of the second register R2 under control of the second clock signal Ck2. Thus, the second register R2 always contains a reference signal which is stored in the individual cells R21 to R2m. The clock input of the second register R2, too, is connected to the output of the frequency-divider circuit FF, whereas the cells R11 to R1m of the first register R1 are clocked by the first clock signal Ck1, whereby the contents of the delay line V are written into the first register R1.

The digital phase meter circuit in accordance with the invention further includes a row of m XOR gates G1 to Gm. The first input 1 of the kth XOR gate Gk is connected to the output of the corresponding kth cell R1k of the first register R1, and the second input to the output of the corresponding kth cell R2k of the second register R2. The inputs of the kth cells of both the first register R1 and the second register R2 are connected to the output of the corresponding kth delay element Vck, as shown in FIG. 1.

The outputs of each pair of cells of the registers R1 and R2 are thus combined by an XOR gate. Accordingly, the gates G1 to Gm provide a logic 1 when their input signals differ.

The digital phase meter circuit in accordance with the invention further includes the multiple adder Ma, which is implemented to advantage in the known tree structure ("carry-save adder"). The multiple adder has m inputs each of which is connected to the output of one of the XOR gates G1 to Gm, and delivers an n-bit output signal. It thus counts the number of Logic 1s, which is obviously zero when all inputs of the gates G1 to Gm are alike, which is the case when the clock signals Ck1 and Ck2 are in phase.

A control signal Ct is supplied to the multiple added Ma over a line Lt. It appears at the first input 1 of the first XOR gate G1 and at the output of the first register cell R11 and is thus assigned to a zero delay.

If X is the number of logic 1s at the inputs of the multiple adder Ma, the binery signal B at the output A is B=X if Ct=1

B=m−X if Ct=0.

As mentioned earlier, the number m of delay elements of the delay line V, the number of cells of the registers R1, R2, and the number of XOR gates G1 to Gm is preferably chosen to be equal to $2^n$, with the number of bits of the output of the multiple adder being equal to n, and the overflow, e.g., if X=0, m−0=m, being left out of account. If its output signal is interpreted as an n-bit fraction, the multiple adder Ma thus delivers precisely the desired result, namely the relative position of the edge of a pulse of the clock signal Ck1 in the sampling interval of the clock pulse Ck2.

Figure 2:
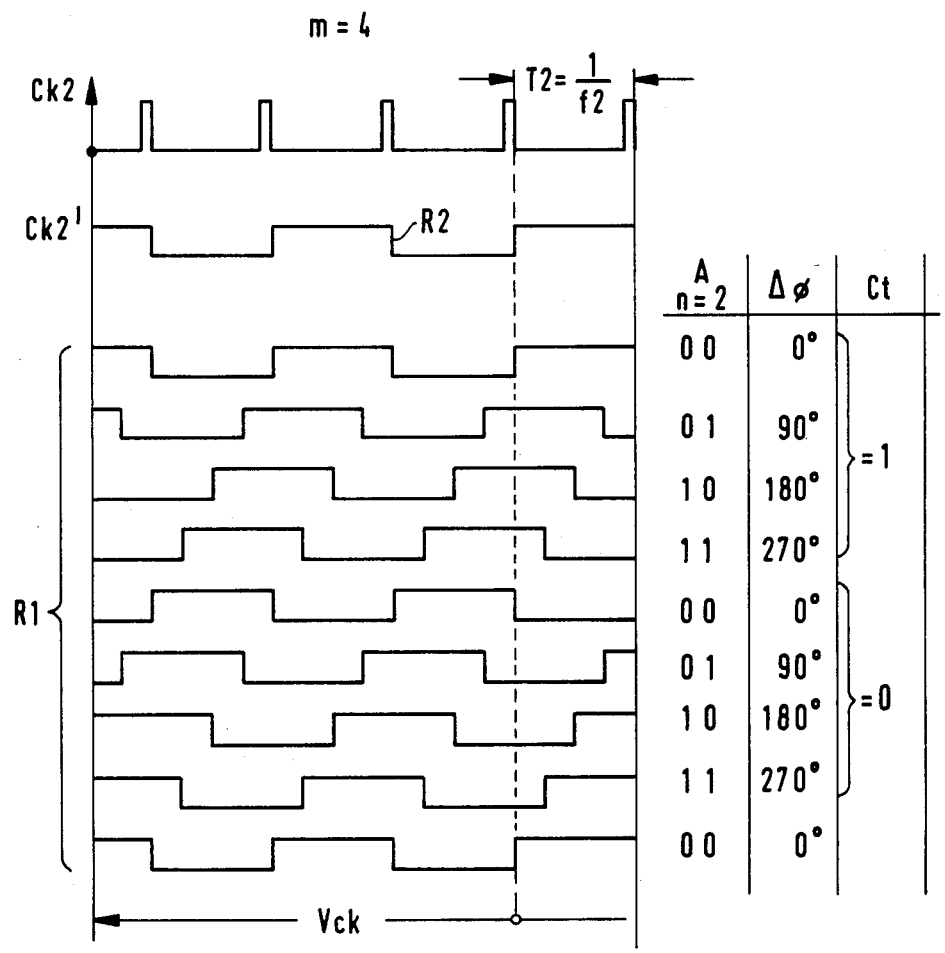

FIG. 2 shows a few typical states of such a digital phase meter circuit where m=4 and, hence, n=2, and the digital values obtained at the output A of the multiple adder Ma. It illustrates the operation of the frequency-divider circuit FF, whose input is supplied with the clock pulse Ck2, and whose output provides the clock pulse Ck2', which is applied to the input of the delay line V and clocks the second register R2. FIG. 2 also shows the signals obtained at the output A of the multiple adder if the phase position is 0°, 90°, 180° or 270°.

For practical applications in digital television, $m=2^6=64$ is sufficient. The delay line consists of unclocked gates.

To implement the digital phase meter circuit of FIG. 1 in 3M HMOS technology, i.e., with conductor widths of 3M, an area of about 1.7 mm$^2$ is required.

What is claimed is:

1. A digital phase meter circuit for determining the phase differences between the edge of a pulse of a first clock signal and the edge of a pulse of a second clock signal within the sampling interval of two pulses of said second clock signal, said circuit comprising:

a frequency-divider circuit having an input receiving said second clock signal, and having an output;

a delay line comprising a row of m delay elements, said delay line having its input coupled to said frequency divided output;

a second register containing a row of m cells (R21 . . . R2m) each of which is clocked by the signal provided at the output of said frequency-divider circuit;

a first register containing a row of m cells clocked by said first clock signal;

a row of m XOR gates in which the first input of the kth XOR gate is connected to the output of the corresponding kth cell of said first register, and the second input to the output of the corresponding kth cell of said second register whereas the inputs of the kth cells of both said first register and said second register are connected to the output of the corresponding kth delay element;

a multiple adder having m inputs each connected to the output of one of said XOR gates having a control-input and generating an n-bit output signal; and a connection between the output of the first cell of said first register and said control input of said multiple adder.

2. A digital phase meter circuit in accordance with claim 1, wherein m is equal to $2^n$, and n is an integer.

* * * * *

UNITED STATES PATENT AND TRADEMARK OFFICE
CERTIFICATE OF CORRECTION

PATENT NO. : 4,721,905

DATED : January 26, 1988

INVENTOR(S) : Soenke Mehrgardt

It is certified that error appears in the above-identified patent and that said Letters Patent is hereby corrected as shown below:

On the first page containing the ABSTRACT, first column, after "[22] Filed: Dec. 11, 1986", insert:

[30] Foreign Application Priority Data:

December 12, 1985  European Pat. Off.  85115842.8

Signed and Sealed this

Thirteenth Day of September, 1988

Attest:

DONALD J. QUIGG

Attesting Officer

Commissioner of Patents and Trademarks